United States Patent [19]

Mikoshiba

[11] Patent Number: 5,168,336
[45] Date of Patent: Dec. 1, 1992

[54] DYNAMIC RANDOM ACCESS MEMORY DEVICE WITH TRENCH TYPE MEMORY CELL

[75] Inventor: Hiroaki Mikoshiba, Tokyo, Japan
[73] Assignee: NEC Corporation, Tokyo, Japan
[21] Appl. No.: 722,574
[22] Filed: Jun. 27, 1991

[30] Foreign Application Priority Data

Jun. 27, 1990 [JP] Japan .................................. 2-168937

[51] Int. Cl.[5] .................................... H01L 29/68
[52] U.S. Cl. .................................... 257/303; 257/302
[58] Field of Search ...................... 357/23.6, 51, 23.1

[56] References Cited

U.S. PATENT DOCUMENTS

| 4,408,304 | 10/1983 | Nashizawa | 357/23.6 |
| 4,897,700 | 1/1990 | Nakamura | 357/23.6 |
| 5,027,172 | 6/1991 | Jeon | 357/51 |

Primary Examiner—Eugene R. LaRoche
Assistant Examiner—R. A. Ratliff
Attorney, Agent, or Firm—Sughrue, Mion, Zinn, Macpeak & Seas

[57] ABSTRACT

A dynamic random access memory cell comprises a switching transistor and a storage capacitor formed in a relatively deep trench and having a capacitor electrode projecting over the major surface of the semiconductor substrate, wherein the switching transistor comprises a source/drain region formed along a wall portion defining the relatively deep trench, another source/drain region formed in the major surface portion, a channel region extending partially along a wall portion defining a relatively shallow trench and partially beneath the major surface so that a channel length is prolonged, thereby decreasing an occupation area without any punch-through phenomenon.

8 Claims, 3 Drawing Sheets

DYNAMIC RANDOM ACCESS MEMORY DEVICE WITH TRENCH TYPE MEMORY CELL

FIELD OF THE INVENTION

This invention relates to a dynamic random access memory device of an ultra-large scale integration and, more particularly, to a trench type memory cell incorporated in such a dynamic random access memory device.

DESCRIPTION OF THE RELATED ART

Various kinds of the memory cells have been proposed for the random access memory device, and the configuration of the memory cell is improved for an ultra-large scale integration of the next generation. The memory cell is usually featured by the storage capacitor of either stacked or trench type. However, a 16 megabit random access memory device is rarely fabricated from the memory cells of the stacked or trench type, because the miniaturization encounters shortage of the capacitance of the storage capacitor.

A structure of the storage capacitor has been proposed by Watanabe et. al. in proceedings of the International Electron Devices Meeting, IEDM 1988, No. 26.6. Watanabe's structure is a combination of the stacked and trench types. FIG. 1 shows the structure of the memory cell featured by the storage capacitor of the combined type, and the memory cell is fabricated on a semiconductor substrate 1. On the semiconductor substrate 1 is selectively grown a thick field oxide 2 which defines a plurality of active areas in the major surface of the semiconductor substrate 1. A trench is formed in the semiconductor substrate 1, and is exposed to the major surface in the active area. N-type impurity atoms are heavily doped in the wall portion 3 of the semiconductor substrate 1 which defines the trench, and another heavily-doped n-type impurity region 4 is further formed in the semiconductor substrate 1 in spacing relation with the heavily-doped n-type wall portion. A gate oxide film 5 is grown on the major surface of the semiconductor substrate 1, and a word line or a gate electrode 6a is patterned on the gate oxide film 5 over that area between the heavily-doped n-type impurity region 4 and the heavily doped n-type wall portion 3. A word line 6b shared by other memory cells extends over the thick field oxide film 2, and the word lines or the gate electrodes are covered with an inter-level oxide film 7. The heavily-doped n-type impurity region 4, the heavily-doped n-type wall portion 3, the gate oxide film 5 and the gate electrode 6a as a whole constitute a switching transistor TR1, and the switching transistor TR1 occupies the major surface area of the semiconductor substrate 1.

The trench is filled with heavily doped n-type polysilicon 8, and a thin dielectric film 9 is formed along the surface of the heavily-doped n-type polysilicon 8. The thin dielectric film 9 also defines a narrow trench, and the narrow trench is filled with a capacitor electrode 10. The capacitor electrode 10 projects from the trench and laterally extends over the word lines or the gate electrode 6a and 6b. The heavily doped n-type polysilicon 8, the thin dielectric film 9 and the capacitor electrode 10 form in combination a storage capacitor SC1, and the storage capacitor is provided partially in the semiconductor substrate 1 and partially over the semiconductor substrate 1, Thus, the storage capacitor shown in FIG. 1 is of the combined type, and the memory cell is featured by the combined type storage capacitor. Since the heavily doped n-type polysilicon 8 and the capacitor electrode 10 vertically extend from the major surface of the semiconductor substrate 1 and are partially overlapped with the switching transistor TR1, the memory cell consumes a relatively small amount of space on the semiconductor substrate 1, and fairly improves the integration density of the random access memory device.

However, the heavily doped n-type wall portion 3 deeply projects into the semiconductor substrate 1, and an undesirable punch-through phenomenon tends to take place just like a field effect transistor with deep source/drain regions. The punch-through phenomenon may cause the switching transistor to suffer from a decrease in the threshold level and, accordingly, from an increase of sub-threshold current. If a channel length between the heavily doped n-type wall portion 3 and the heavily doped n-type impurity region 4 is sufficiently lengthened, the undesirable punch-through phenomenon is effectively restricted. Thus, prior art random access memory devices increase the channel length in order to avoid the undesirable punch-through phenomenon. In fact, in the prior art random access memory devices, the channel length is made two or three times as large as the minimum diameter F of the trench for the target capacitance of the storage capacitor SC1. Alternatively, the channel length is adjusted to a length F, and the switching transistor TR1 is spaced apart from the storage capacitor SC1 by a distance of F or 2F. In either type of prior art random access memory device, each memory cell occupies a large amount of active area, and a side of the active area is extended by F or 2F in comparison with that of the active area theoretically necessary for a memory cell of the combined type.

Thus, the prior art random access memory cell of the combined type still exhibits a trade-off between the occupation area and the integration density.

SUMMARY OF THE INVENTION

It is therefore an important object of the present invention to provide a random access memory device which is desirable for ultra large scale integration without exhibiting any punch-through phenomenon.

To accomplish the object, the present invention proposes to form a channel region of a switching transistor along a relatively shallow trench for increasing the channel length.

In accordance with the present invention, there is provided a dynamic random access memory device fabricated on a semiconductor substrate having a major surface, comprising: a memory cell array having a plurality of memory cells, each of the memory cells comprising a) a storage capacitor formed in a relatively deep trench exposed to the major surface, and having an electrode projecting from the major surface; and b) a switching transistor having b-1) a first impurity region extending along a wall portion defining the relatively deep trench, b-2) a second impurity region formed in a major surface portion of the semiconductor substrate beneath the major surface, b-3) a channel region electrically interconnecting the first and second impurity regions and extending partially along another wall portion defining a relatively shallow trench exposed to the major surface and partially beneath the major surface, b-4) a gate insulating film extending partially on the aforesaid another wall portion and partially on the major surface, b-5) and a gate electrode formed on the gate insulating film.

The relatively shallow trench may be contiguous to the relatively deep trench or slightly spaced apart from the relatively deep trench. Since the relatively shallow trench increases the channel length without increase of the occupation area, undesirable punch-through phenomena hardly takes place.

BRIEF DESCRIPTION OF THE DRAWINGS

The features and advantages of the random access memory device according to the present invention will be more clearly understood from the following description taken in conjunction with the accompanying drawings in which.

DESCRIPTION OF THE PREFERRED EMBODIMENTS

First Embodiment

Figure 1:
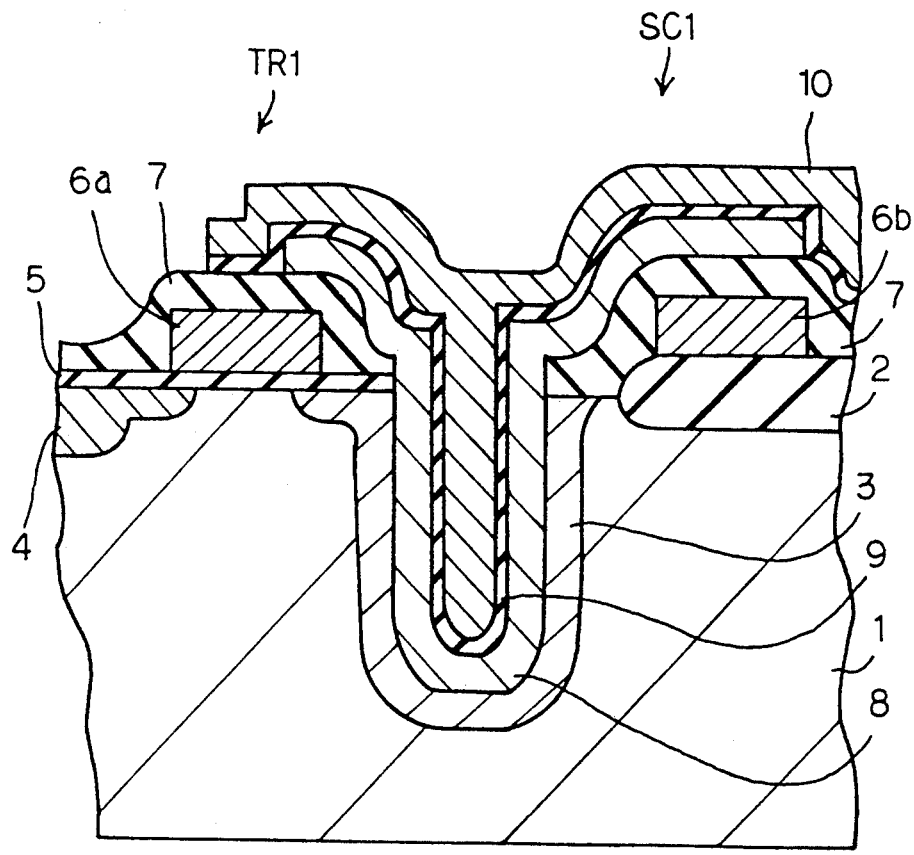
FIG. 1 is a cross sectional view showing the structure of the prior art random access memory cell of the combined type.
Figure 2:
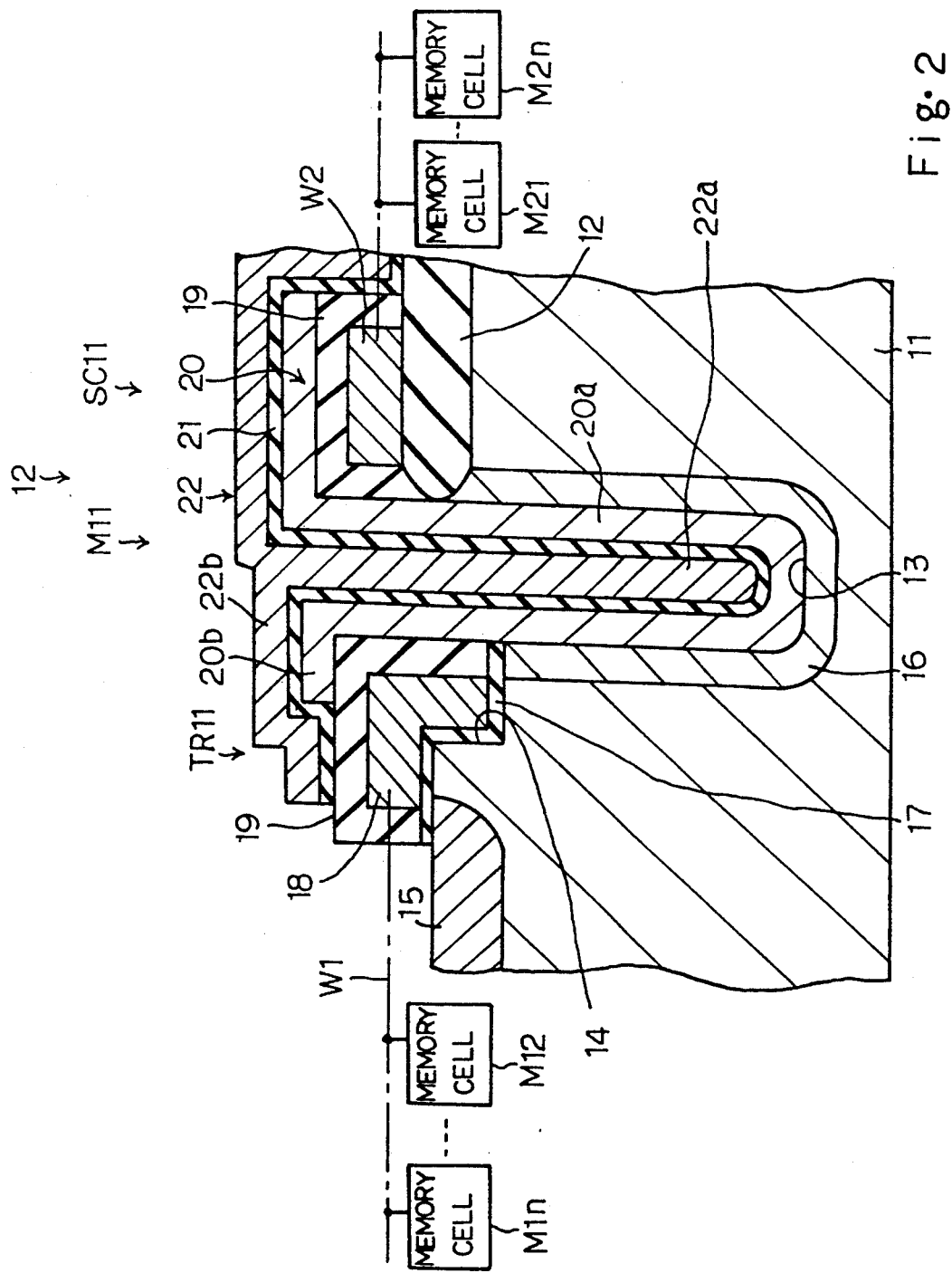
FIG. 2 is a cross sectional view showing the structure of a random access memory cell according to the present invention.

Referring first to FIG. 2 of the drawings, a random access memory device embodying the present invention is fabricated on a lightly doped p-type silicon substrate 11, and comprises a memory cell array 12 associated with various peripheral circuits. Although a large number of memory cells are incorporated in the memory cell array 12, only one memory cell M11 is sectioned because of similarity of the structure.

On the lightly doped p-type silicon substrate 11 is selectively grown a thick field oxide film 12, and the major surface of the lightly doped p-type silicon substrate 11 is divided into a plurality of active areas. In one of the active areas, a relatively deep trench 13 vertically projects from the major surface into the lightly doped p-type silicon substrate 11, and a relatively shallow trench 14 is further formed in the lightly doped p-type silicon substrate 11. The relatively shallow trench 14 is contiguous to the relatively deep trench 13, and, therefore, the wall defining the relatively deep trench 13 is partially cut away.

A heavily doped n-type impurity region 15 is formed in the active area, and is exposed to the major surface. The relatively deep trench 13 is defined by a wall, and another heavily doped n-type impurity region 16 is formed along the wall portion defining the relatively deep trench 13. In this instance, the heavily doped n-type impurity regions 16 and 15 serve as first and second impurity regions, respectively. The wall defining the relatively shallow trench is covered with a thin gate insulating film 17, and the thin gate insulating film 17 further extends over the major surface, and, accordingly, a conductive channel is provided beneath the thin gate insulating film 17. Since a part of the thin gate insulating film 17 extends in the vertical direction, the conductive channel also has a vertical portion, and the vertical portion increases an effective channel length without spacing the heavily doped n-type impurity regions 15 and 16 far apart from each other. A word line W1 partially extends on the thin gate insulating film 17 and provides a gate electrode 18 as well as gate electrodes of memory cells M12 to M1n. The heavily-doped n-type impurity regions 15 and 16, the conductive channel, the gate insulating film 17 and the gate electrode 18 as a whole constitute a switching transistor TR11 of the memory cell M11. On the thick field oxide film 12 extends another word line W2 which provides gate electrodes of memory cells M21 to M2n.

The word lines W1 and W2 are covered with an inter-level insulating film 19, and a through hole is formed in the inter-level insulating film 19. The through hole is substantially aligned with the relatively deep trench 13, and the relatively deep trench 13 and the through hole are filled with a heavily doped n-type polysilicon 20. The heavily-doped n-type polysilicon 20 is held in contact with the heavily-doped n-type impurity region 16, and is, therefore, coupled to the switching transistor TR11. The heavily-doped n-type polysilicon 20 has a trunk portion 20a accommodated in the relatively deep trench 13 and the through hole, and a brim portion 20b laterally projecting from the trunk portion 20a. The trunk portion 20a projects from the through hole, and the brim portion 20b extends on the inter-level insulating film 19. The heavily doped n-type polysilicon 20 defines a secondary trench, and a thin dielectric film 21 perfectly covers the surface of the heavily doped n-type polysilicon 20. The thin dielectric film 21 also defines a tertiary trench. The tertiary trench is filled with a counter electrode 22, and the counter electrode 22 has a trunk portion 22a accommodated in the tertiary trench and a brim portion 22b laterally projecting from the trunk portion 22a. Though not shown in the drawings, the counter electrode 22 is shared between the memory cell M11 and other memory cells of the memory cell array 12. The heavily doped polysilicon 20, the thin dielectric film 21 and the counter electrode 22 as a whole constitute a storage capacitor SC11.

Since the brim portion 22b of the counter electrode 22 is partially located over the switching transistor TR11 and partially over the thick field oxide film 12, the storage capacitor SC11 occupies an extremely small amount of space approximately equal to the relatively deep trench 13, and, for this reason, the structure of the memory cell M11 is suitable for ultra large scale integration.

The structure shown in FIG. 2 effectively decreases the occupation area of the memory cell M11. In detail, if the relatively shallow trench 14 is about 0.5 microns in depth, the heavily doped impurity region 15 laterally spaced apart from the heavily doped n-type impurity region 16 by about 0.5 micron results in a conductive channel equivalent to a flat conductive channel of 1 micron. This is long enough to prevent a switching transistor associated with a trench type storage capacitor from exhibiting an undesirable punch-through phenomenon. In this instance, the relatively deep trench 13 is about 0.5 microns in diameter (F), the occupation area of each memory cell is defined by the minimum dimension of 2F, and the minimum dimension 2F is shorter than that of the prior art memory cell by F to 2F.

The memory cell M11 shown in FIG. 2 is fabricated through a process sequence described hereinbelow. The process sequence starts with preparation of the semiconductor substrate 11, and the thick field oxide film 12 is selectively grown on the major surface of the semiconductor substrate 11. The relatively shallow trench 14 is formed in the major surface portion of the semiconductor substrate 11, and the thin gate insulating film 17 is grown on the major surface as well as the wall defining the relatively shallow trench 14. Polysilicon is deposited on the entire surface of the structure, and is, then, selectively etched away so that word lines W1 and W2 are patterned. Using the word lines W1 and W2 as a mask, n-type impurity atoms are ion-implanted into the semiconductor substrate 11 so that the heavily doped n-type impurity region 15 is formed. Silicon oxide is deposited on the entire surface of the structure, and a photoresist film is spun onto the silicon oxide film. The photoresist film is formed into a photoresist mask, and the silicon oxide film and the semiconductor substrate 11 are successively removed to form the inter-level insulating film 19 with the through hole and the relatively deep trench 13. Heavily doped n-type polysilicon is deposited on the entire surface of the structure, and fills the relatively deep trench 13. N-type impurity atoms are diffused from the heavily doped n-type polysilicon film into the wall portion defining the relatively deep trench 13, and the heavily doped n-type impurity region 16 is produced along the relatively deep trench 13. The heavily doped n-type polysilicon film is patterned so that the heavily doped n-type polysilicon 20 extends along the relatively deep trench 13 as well as on the inter-level insulating film 19. The thin dielectric film 21 is formed on and covers the heavily doped polysilicon 20. Finally, the counter electrode 22 is provided on the thin dielectric film 21 in opposing relationship to the heavily doped n-type polysilicon 20.

Second Embodiment

Figure 3:
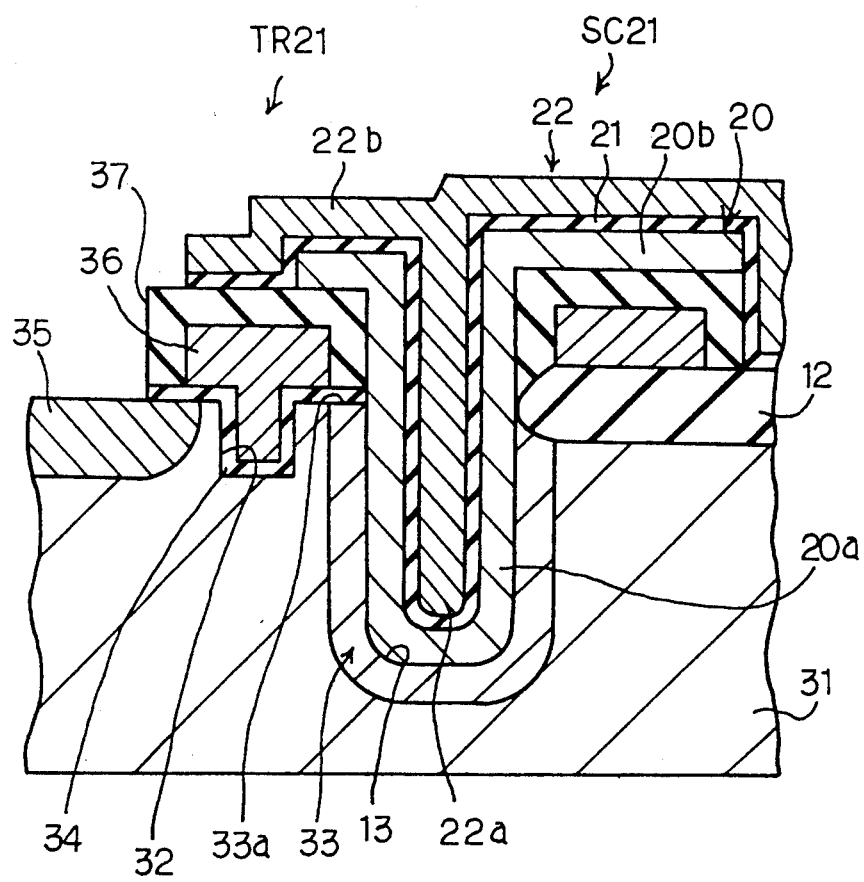
FIG. 3 is a cross sectional view showing the structure of another random access memory cell according to the present invention.

Turning to FIG. 3 of the drawings, a memory cell incorporated in another dynamic random access memory device largely comprises a storage capacitor SC21 and a switching transistor TR21 both fabricated on a lightly doped p-type silicon substrate 31. The component films of the storage capacitor SC21 are similar to those of the storage capacitor SC11, and, for this reason, the component films are designated by the same references used in FIG. 2 without detailed description.

A relatively shallow trench 32 is formed in the major surface portion of the silicon substrate 31 in spacing relation with the relatively deep trench 13, and, accordingly, the relatively shallow trench 32 has two vertical surfaces and a bottom surface. A first heavily doped n-type impurity region 33 is formed along the relatively deep trench 13, and an upper peripheral surface 33a of the first heavily doped n-type impurity region 33 is exposed to the major surface of the silicon substrate 31. A thin gate insulating film 34 is formed on the vertical surface, the bottom surface, the major surface between the relatively shallow trench 32 and a second heavily doped n-type impurity region 35 and the major surface between the relatively shallow trench 32 and the upper peripheral surface 33a. A gate electrode 36 is formed on the thin gate insulating film 34, and, for this reason, a conductive channel takes place along the major surfaces, the two vertical surfaces and the bottom surface. Since the conductive channel vertically extends twice, the effective channel length is prolonged in so far as the lateral distance between the first and second heavily doped n-type impurity regions 33 and 35 are approximately equal to that of the first embodiment. The first and second heavily doped n-type impurity regions 33 and 35, the thin gate insulating film 34 and the gate electrode 36 as a whole constitute the switching transistor TR21.

The gate electrode 36 is covered with an inter-level insulating film 37, and a through hole is formed and substantially aligned with the relatively deep trench 13. The heavily doped n-type polysilicon 20 is formed in the relatively deep trench 13, and partially extends on the inter-level insulating film 37 so as to be partially overlapped with the gate electrode 36.

Only the storage capacitor of the prior art memory cell is formed in the trench; however, the memory cell according to the present invention is formed in the two trenches different in depth.

As will be understood from the foregoing description, the random access memory cell according to the present invention has the switching transistor TR11 or TR21 partially formed in the relatively shallow trench 14 or 32, and, for this reason, the effective channel length is lengthened without sacrifice of the occupation area. This results in the dynamic random access memory cell suitable for ultra large scale integration and free from the undesirable punch-through phenomenon.

Although particular embodiments of the present invention have been shown and described, it will be obvious to those skilled in the art that various changes and modifications may be made without departing from the spirit and scope of the present invention. For example, another implementation may have a storage capacitor with a dielectric film structure consisting of two or more than two different dielectric films. Such a composite dielectric film structure may consist of a silicon oxide film and a silicon nitride film, or a silicon nitride film sandwiched between two silicon oxide films.

What is claimed is:

1. A dynamic random access memory device fabricated on a semiconductor substrate having a major surface, comprising: a memory cell array having a plurality of memory cells, each of said memory cells comprising
   a) a storage capacitor formed in a relatively deep trench exposed to said major surface, and having an electrode projecting from said major surface; and
   b) a switching transistor having b-1) a first impurity region extending along a wall portion defining said relatively deep trench, b-2) a second impurity region formed in a major surface portion of said semiconductor substrate beneath said major surface, b-3) a channel region electrically interconnecting said first and second impurity regions and extending partially along another wall portion defining a relatively shallow trench exposed to said major surface and partially beneath said major surface, b-4) a gate insulating film extending partially on said another wall portion and partially on said major surface, and b-5) a gate electrode formed on said gate insulating film.

2. A dynamic random access memory device as set forth in claim 1, in which said relatively shallow trench is contiguous to said relatively deep trench.

3. A dynamic random access memory device as set forth in claim 2, in which said channel region has a predetermined length long enough to prevent said switching transistor from exhibiting a punch-through effect phenomenon.

4. A dynamic random access memory device as set forth in claim 3, in which said another wall portion has a bottom surface and a vertical surface of about 0.5 micron in length, and in which the total length of said bottom surface between said first impurity region and said vertical surface and said major surface between said second impurity region and said vertical surface is about 0.5 micron.

5. A dynamic random access memory device as set forth in claim 4, in which said gate electrode is covered with an inter-level insulating film having a through hole substantially aligned with said relatively deep trench, and in which said storage capacitor comprises a-1) said electrode projecting from said relatively deep trench as well as said through hole and extending on said inter-level insulating film so as to be partially overlapped with said gate electrode, said electrode defining a secondary trench, a-2) a dielectric film structure covering said electrode and defining a tertiary trench, and a-3) a counter electrode filling said tertiary trench and extending on said dielectric film.

6. A dynamic random access memory device as set forth in claim 1, in which said relatively shallow trench is spaced apart from said relatively deep trench.

7. A dynamic random access memory device, as set forth in claim 6, in which said relatively shallow trench has two vertical surfaces and a bottom surface, and in which said channel region extends along said two vertical surfaces and said bottom surface.

8. A dynamic random access memory device as set forth in claim 7, in which said gate electrode is covered with an inter-level insulating film having a through hole substantially aligned with said relatively deep trench, and in which said storage capacitor comprises a-1) said electrode projecting from said relatively deep trench as well as said through hole and extending on said inter-level insulating film so as to be partially overlapped with said gate electrode, said electrode defining a secondary trench, a-2) a dielectric film structure covering said electrode and defining a tertiary trench, and a-3) a counter electrode filling said tertiary trench and extending on said dielectric film.

* * * * *